United States Patent
Liu et al.

(10) Patent No.: US 11,866,616 B2
(45) Date of Patent: Jan. 9, 2024

(54) WAVE-ABSORBING IMPREGNATION GLUE LIQUID, WAVE-ABSORBING HONEYCOMB, AND PREPARATION METHODS THEREOF

(71) Applicants: LUOYANG INSTITUTE OF CUTTING-EDGE TECHNOLOGY, Henan (CN); LUOYANG CUTTING EDGE EQUIPMENT TECHNOLOGY LTD, Henan (CN)

(72) Inventors: Ruopeng Liu, Shenzhen (CN); Zhiya Zhao, Shenzhen (CN); Lu Zhang, Shenzhen (CN); Yunxiang Zhang, Shenzhen (CN); Yan Hou, Shenzhen (CN)

(73) Assignees: LUOYANG INSTITUTE OF CUTTING-EDGE TECHNOLOGY, Henan (CN); LUOYANG CUTTING EDGE EQUIPMENT TECHNOLOGY LTD, Henan (CN)

( * ) Notice: Subject to any disclaimer, the term of this patent is extended or adjusted under 35 U.S.C. 154(b) by 934 days.

(21) Appl. No.: 16/702,796

(22) Filed: Dec. 4, 2019

(65) Prior Publication Data

US 2020/0115598 A1    Apr. 16, 2020

Related U.S. Application Data

(63) Continuation of application No. PCT/CN2018/083678, filed on Apr. 19, 2018.

(30) Foreign Application Priority Data

Jun. 7, 2017   (CN) .......................... 201710420987.6

(51) Int. Cl.
*C09J 163/00*     (2006.01)
*B05D 1/18*       (2006.01)
(Continued)

(52) U.S. Cl.
CPC .............. *C09J 163/00* (2013.01); *B05D 1/18* (2013.01); *B05D 3/007* (2013.01); *C08J 7/00* (2013.01);
(Continued)

(58) Field of Classification Search
CPC . C09J 163/00; C09J 9/00; C09J 11/04; C08G 59/245; C08K 3/04; B05D 1/18;
(Continued)

(56) References Cited

U.S. PATENT DOCUMENTS 3,721,982 A * 3/1973 Wesch ................. H01Q 17/004
                                                   342/1
3,799,796 A * 3/1974 Hunter ..................... B01J 35/02
                                                   427/244
(Continued)

FOREIGN PATENT DOCUMENTS

CN     104341716 A     2/2015
CN     104449239 A     3/2015
(Continued)

OTHER PUBLICATIONS

International Search Report for corresponding application PCT/CN2018/083678 filed Apr. 19, 2018; dated Jul. 10, 2018.
(Continued)

*Primary Examiner* — Brian K Talbot
(74) *Attorney, Agent, or Firm* — CANTOR COLBURN LLP

(57) ABSTRACT

Provided a wave-absorbing impregnation glue liquid, including: two-component epoxy resin, a solvent, a polyether siloxane, and a carbon powder; wherein a mass ratio of the two-component epoxy resin to the solvent is 1:3~1:5, a mass ratio of the two-component epoxy resin to the carbon powder is 3:1~6:1, and a mass fraction of the polyether siloxane in the wave-absorbing impregnation glue
(Continued)

liquid is 0.05%~0.2%. A wave-absorbing impregnation glue liquid, a wave-absorbing honeycomb and their preparation methods are further provided.

9 Claims, 2 Drawing Sheets

(51) Int. Cl.
| | |
|---|---|
| B05D 3/00 | (2006.01) |
| C09J 9/00 | (2006.01) |
| C09J 11/04 | (2006.01) |
| H05K 9/00 | (2006.01) |
| C08J 7/00 | (2006.01) |
| C08G 59/24 | (2006.01) |
| C08G 59/50 | (2006.01) |
| C08K 3/04 | (2006.01) |
| C08L 83/12 | (2006.01) |

(52) U.S. Cl.
CPC ............... *C09J 9/00* (2013.01); *C09J 11/04* (2013.01); *H05K 9/0081* (2013.01); B05D 2201/02 (2013.01); B05D 2504/00 (2013.01); C08G 59/245 (2013.01); C08G 59/502 (2013.01); C08G 59/5033 (2013.01); C08K 3/04 (2013.01); C08L 83/12 (2013.01); C09J 2301/50 (2020.08)

(58) Field of Classification Search
CPC .............. B05D 3/007; B05D 2201/02; B05D 2504/00; H05K 9/0081; H05K 9/0083
USPC ......................................................... 427/498
See application file for complete search history.

(56) References Cited

U.S. PATENT DOCUMENTS

| | | | | | |
|---|---|---|---|---|---|
| 4,600,619 | A | * | 7/1986 | Chee | ............ B32B 5/24 156/173 |
| 5,575,882 | A | * | 11/1996 | Holz | ............ B32B 7/10 428/116 |
| 5,940,022 | A | * | 8/1999 | Takatsu | ............ H05B 6/6494 342/1 |
| 6,596,373 | B1 | * | 7/2003 | Kishi | ............ C08L 63/00 428/116 |
| 11,426,950 | B2 | * | 8/2022 | Doneker | ............ H05K 9/009 |
| 2008/0311373 | A1 | | 12/2008 | Hsu | |
| 2011/0227775 | A1 | * | 9/2011 | Hirose | ............ H01Q 17/00 342/1 |
| 2011/0278058 | A1 | * | 11/2011 | Sundararaj | ............ H05K 9/009 977/932 |
| 2012/0135186 | A1 | * | 5/2012 | Beall | ............ B29C 48/11 428/116 |
| 2013/0319727 | A1 | * | 12/2013 | Wen | ............ B64C 3/185 156/60 |
| 2016/0010251 | A1 | * | 1/2016 | Moegel | ............ B29D 24/002 156/197 |
| 2017/0168606 | A1 | * | 6/2017 | Lu | ............ B43L 1/00 |
| 2020/0321705 | A1 | * | 10/2020 | Liu | ............ H01Q 17/008 |

FOREIGN PATENT DOCUMENTS

| | | | | |
|---|---|---|---|---|
| CN | 105297530 | A | | 2/2016 |
| CN | 105348967 | A | | 2/2016 |
| CN | 105751590 | A | | 7/2016 |
| CN | 105818453 | A | | 8/2016 |
| CN | 106046982 | A | | 10/2016 |
| CN | 106498757 | A | | 3/2017 |
| GB | 2264589 | A | * | 9/1993 ............ B32B 25/08 |
| JP | 01258496 | A | * | 10/1989 |
| JP | 03204999 | A | * | 9/1991 |
| JP | 07038277 | A | * | 2/1995 |
| JP | 2000013084 | A | * | 1/2000 |
| JP | 2002348987 | A | | 12/2002 |
| KR | 20160087958 | A | | 11/2017 |

OTHER PUBLICATIONS

European Search Report for corresponding application EP18813772; dated Dec. 3, 2020.

* cited by examiner

WAVE-ABSORBING IMPREGNATION GLUE LIQUID, WAVE-ABSORBING HONEYCOMB, AND PREPARATION METHODS THEREOF

CROSS REFERENCE TO RELATED APPLICATIONS

This application is a continuation of International Patent Application Number PCT/CN2018/083678 filed on Apr. 19, 2018, which claims priority to Chinese Patent Application Number 201710420987.6 filed on Jun. 7, 2017, whereby the entire contents of both of said applications are incorporated herein by reference.

TECHNICAL FIELD

The present disclosure relates to the field of composite materials, and particularly to a wave-absorbing impregnation glue liquid, a wave-absorbing honeycomb, and preparation methods thereof.

BACKGROUND

With continuous development of modern technology, more and more electronic products are entering into people's daily life and work, and people are more and more dependent on the electronic products. But the electronic products are bringing more and more convenience to people's life, at the same time, the large amount of electromagnetic radiation generated by the electronic products also cause a great threat to people's health. For example, at an airport, an airplane flight cannot take off due to electromagnetic interference; in a hospital, a mobile phone usually interferes with normal operations of various electronic diagnostic instruments. Therefore, it is very important to study a wave-absorbing material that can better resist and weaken electromagnetic wave radiation.

Furthermore, in the military, if the wave-absorbing materials can be coated on various weapons and military equipments, such as aircraft, missiles, tanks, ships, and warehouses, etc., it can absorb the reconnaissance waves and attenuate the reflected signals, thereby breaking through the enemy radar's defense zone. This is a powerful means of anti-radar reconnaissance, which can reduce the attack of weapon systems by missiles and laser weapons. Therefore, the study of wave-absorbing materials is of great value in enhancing national military capabilities and improving the combat effectiveness of the military.

The honeycomb structure has a material shape similar to that of a natural honeycomb. It has a unique hexagonal structure that can withstand the external force and is lighter in weight, ensuring sufficient strength while minimizing the weight of the material. Therefore, the material of the honeycomb structure is an important substrate material.

Coating the wave-absorbing adhesive on the honeycomb structure is one of the important means to prepare the wave-absorbing honeycomb. It can meet the requirements of the wave-absorbing material for "thin thickness, light weight, wide bandwidth, and strong absorption". However, the impregnation process of the existing honeycomb is to use a hair dryer or a compressed gas to blow off glue liquid from honeycomb holes, which easily causes the phenomenon of plugging, and seriously affects the quality of the punched honeycomb.

SUMMARY

For problems in the related art, the present disclosure provides a preparation method of a wave-absorbing honeycomb, and the wave-absorbing honeycomb that does not block the hole, has no deformation, and has excellent wave-absorbing performance.

According to a first aspect of the present disclosure, a wave-absorbing impregnation glue liquid includes:
  two-component epoxy resin;
  a solvent;
  a polyether siloxane; and
  a carbon powder; wherein
  a mass ratio of the two-component epoxy resin to the solvent is 1:3~1:5, a mass ratio of the two-component epoxy resin to the carbon powder is 3:1~6:1, and a mass fraction of the polyether siloxane in the wave-absorbing impregnation glue liquid is 0.05%~0.2%.

In one embodiment, in the above wave-absorbing impregnation glue liquid, the mass ratio of the two-component epoxy resin to the solvent is 1:4, the mass ratio of the two-component epoxy resin to the carbon powder is 5:1, and the mass fraction of the polyether siloxane in the wave-absorbing impregnation glue liquid is 0.1%.

In one embodiment, in the above wave-absorbing impregnation glue liquid, the two-component epoxy resin comprises an epoxy resin and a curing agent; the epoxy resin comprises bisphenol A epoxy resin, bisphenol F epoxy resin, or a mixture of the bisphenol A epoxy resin and the bisphenol F epoxy resin; and the curing agent comprises one or more of diethylenetriamine, triethylenetetramine, and tetraethylenepentamine.

In one embodiment, in the above wave-absorbing impregnation glue liquid, a mass ratio of the epoxy resin to the curing agent in the two-component epoxy resin is 100:5~100:20.

In one embodiment, in the above wave-absorbing impregnation glue liquid, the mass ratio of the epoxy resin to the curing agent in the two-component epoxy resin is 10:1.

In one embodiment, in the above wave-absorbing impregnation glue liquid, the solvent is one or more of methanol, ethanol, ethyl acetate, acetone, butanone, and propanol methyl ether.

In one embodiment, in the above wave-absorbing impregnation glue liquid, the polyether siloxane is one or more of a polyether siloxane wetting agent A-008h, a polyether siloxane wetting agent A-004h, and a polyether siloxane wetting agent W-23h.

According to a second aspect of the present disclosure, a preparation method of the above wave-absorbing impregnation glue liquid, wherein the preparation method comprises:
  dissolving the two-component epoxy resin by using the solvent, adding the polyether siloxane; wetting them and uniformly mixing them; and then adding the carbon powder, uniformly mixing the two-component epoxy resin, the solvent, the polyether siloxane, and the carbon powder, so as to obtain the wave-absorbing impregnation glue liquid.

In one embodiment, the above preparation method further comprises:
  after dissolving the two-component epoxy resin by using the solvent, adding the polyether siloxane wetting agent; wetting them, and fastly stirring them for 8-12 minutes to uniformly mix them, so as to obtain a two-component epoxy resin mixed solution;
  adding the carbon powder into the two-component epoxy resin mixed solution, stirring them for 20-40 minutes and ball-milling them for 1.5-2.5 hours to uniformly mix them, so as to obtain the wave-absorbing impregnation glue liquid.

According to a third aspect of the present disclosure, a preparation method of a wave-absorbing honeycomb, wherein the preparation method comprises:

dipping a honeycomb into the above wave-absorbing impregnation glue liquid, taking out the dipped honeycomb, and then curing them, so as to obtain a wave-absorbing honeycomb.

In one embodiment, the above preparation method further comprises:

dipping the honeycomb into the wave-absorbing impregnation glue liquid for 4~6 minutes, taking out the dipped honeycomb, blowing off the wave-absorbing impregnation glue liquid from holes of the dipped honeycomb, and then curing them at a temperature of 80° C.~120° C. for 1~2 hours, so as to obtain the wave-absorbing honeycomb.

In one embodiment, in the above preparation method, the honeycomb is an aramid honeycomb.

According to a fourth aspect of the present disclosure, a wave-absorbing honeycomb prepared according to the above preparation method.

It can be seen that the present disclosure provides the wave-absorbing impregnation glue liquid, the wave-absorbing honeycomb, and the preparation methods thereof. The wave-absorbing adhesive is prepared by using the two-component epoxy resin, the solvent, the wetting agent, and the carbon powder. The wave-absorbing honeycomb is prepared by dipping the honeycomb into the wave-absorbing adhesive and curing them. The present disclosure reduces the surface tension of the wave absorbing adhesive by adding a polyether silicone wetting agent having extremely low surface tension and having antifoaming property, so that the wave-absorbing adhesive is quickly and uniformly spread on the honeycomb surface, so as to the wave-absorbing honeycomb material that does not block the hole, has no deformation, and has excellent wave-absorbing performance, which can be widely used in aerospace, aircraft, radome and the like.

BRIEF DESCRIPTION OF DRAWINGS

To describe the technical solutions in the embodiments of the present disclosure or in the prior art more clearly, the following briefly describes the accompanying drawings required for describing the embodiments. Apparently, the accompanying drawings in the following description show merely some embodiments of the present disclosure, and a person of ordinary skill in the art may still derive other drawings from these accompanying drawings without creative efforts.

DESCRIPTION OF EMBODIMENTS

The following clearly and completely describes the technical solutions in the embodiments of the present disclosure with reference to the accompanying drawings in the embodiments of the present disclosure. Apparently, the described embodiments are merely some but not all of the embodiments of the present disclosure. All other embodiments obtained by a person of ordinary skill in the art based on the embodiments of the present disclosure shall fall within the protection scope of the present disclosure.

Figure 1:
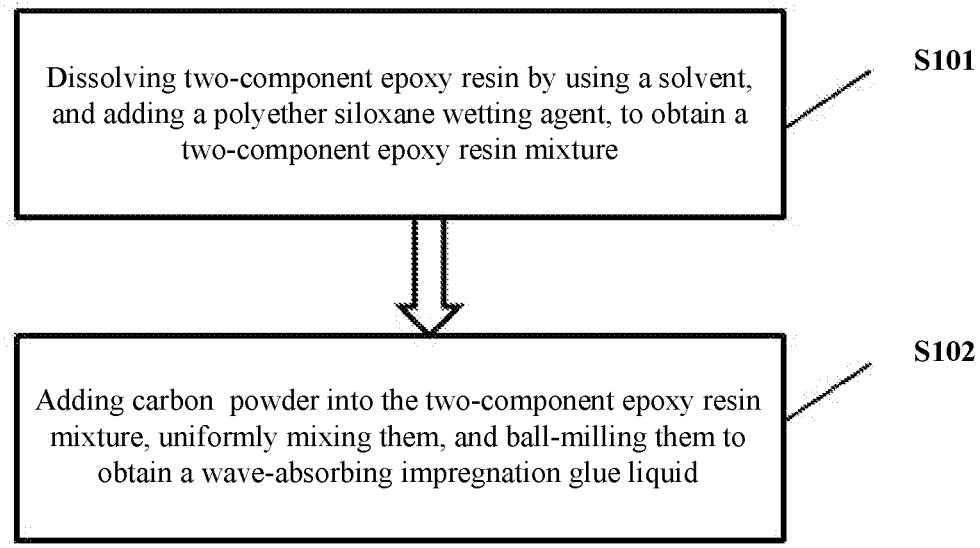
FIG. 1 is a flowchart of preparing a wave-absorbing impregnation glue liquid according to an embodiment of the present disclosure.

Preparation methods of a wave-absorbing impregnation glue liquid and a wave-absorbing honeycomb provided by the present disclosure include the following steps:

Preparation of the wave-absorbing impregnation glue liquid:

As shown in step S101 of FIG. 1, after dissolving two-component epoxy resin by using a solvent, adding a wetting agent, and uniformly mixing them to obtain a mixture. In this step, a mass ratio of the two-component epoxy resin to the solvent is 1:3~1:5. Stirring the two-component epoxy resin, the solvent, and the wetting agent at a stirring rate of 1600~2000 rpm for 8~12 minutes. Preferably, stirring the two-component epoxy resin, the solvent, and the wetting agent at a stirring rate of 1800 rpm for 10 minutes to uniformly mix them, so as to obtain the mixture. The solvent is one or more of ethanol, ethyl acetate, acetone, butanone, and propanol methyl ether. The wetting agent is one or more of a polyether siloxane wetting agent A-008h, a polyether siloxane wetting agent A-004h, and a polyether siloxane wetting agent W-23h.

A mass fraction of the polyether siloxane in the wave-absorbing impregnation glue liquid is 0.05%~0.2%. The two-component epoxy resin includes an epoxy resin and a curing agent. The epoxy resin includes bisphenol A epoxy resin, bisphenol F epoxy resin, or a mixture of the bisphenol A epoxy resin and the bisphenol F epoxy resin. The curing agent includes one or more of diethylenetriamine, triethylenetetramine, and tetraethylenepentamine. A mass ratio of the epoxy resin to the curing agent in the two-component epoxy resin is 100:5~100:20.

As shown in step S102 of FIG. 1, adding the wave-absorbing agent carbon powder into the mixture, uniformly mixing them, and then ball-milling them to obtain a wave-absorbing adhesive; wherein the carbon powder is used as a wave-absorbing agent. In this step, a mass ratio of the two-component epoxy resin to the carbon powder is 3:1~6:1. Stirring the carbon powder and the mixture for 20~40 minutes to uniformly mix them, and then pouring them into a ball milling tank to ball-mill them for 1.5~2.5 hours. Preferably, stirring the carbon powder and the mixture for 30 minutes to uniformly mix them, and then pouring them into the ball milling tank to ball-mill them for 2 hours, so as to obtain the wave-absorbing impregnation glue liquid.

Figure 2:
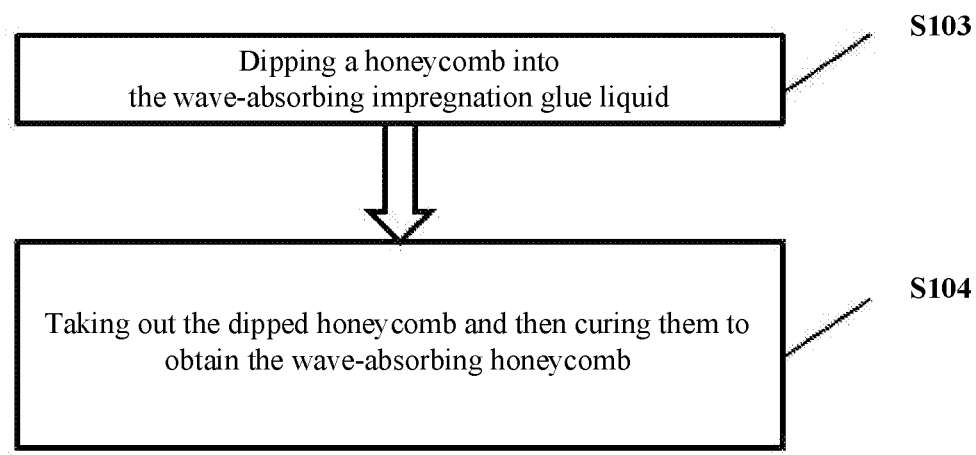
FIG. 2 is a flowchart of preparing a wave-absorbing honeycomb according to an embodiment of the present disclosure.

Preparation of the wave-absorbing honeycomb:

As shown in step S103 in FIG. 2, dipping the honeycomb into the wave-absorbing impregnation glue liquid prepared in step S102. In this step, dipping the honeycomb into the wave-absorbing impregnation glue liquid for 4~6 minutes, and preferably, 5 minutes.

As shown in step S104 in FIG. 2, taking out the dipped honeycomb and then curing them to obtain the wave-absorbing honeycomb. In this step, taking out the dipped honeycomb, blowing off the wave-absorbing impregnation glue liquid from honeycomb holes, and then curing them at a temperature of 80° C.~120° C. for 1~2 hours, so as to obtain the wave-absorbing honeycomb. The honeycomb is an aramid honeycomb.

Figure 3:
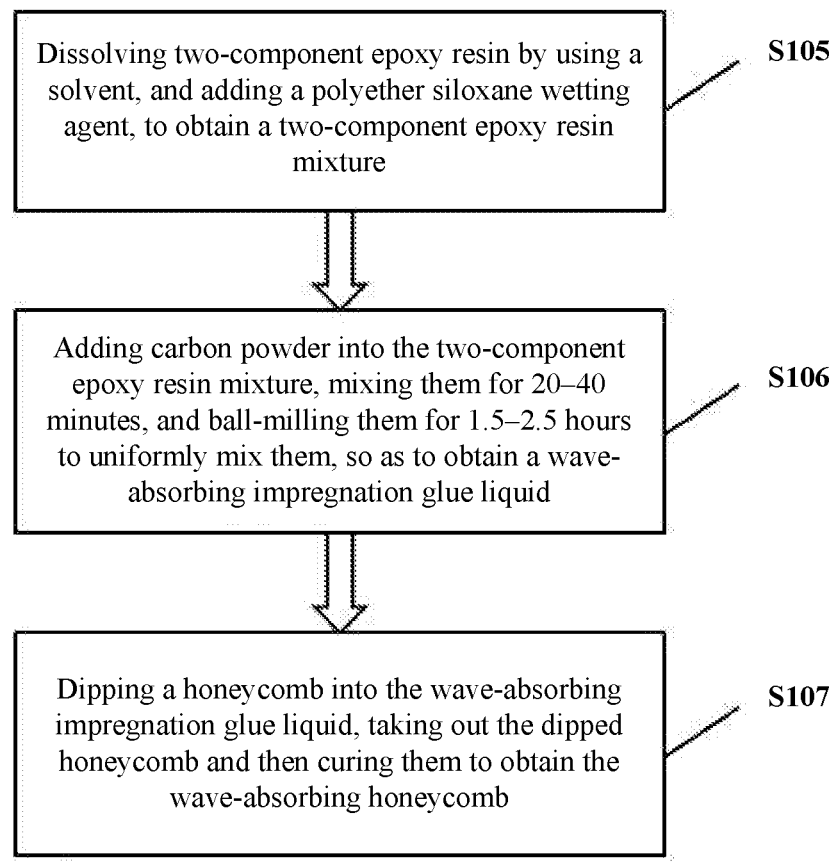
FIG. 3 is an overall flowchart of preparing a wave-absorbing honeycomb according to a preferred embodiment of the present disclosure.

FIG. 3 is an overall flowchart of preparing a wave-absorbing honeycomb according to a preferred embodiment of the present disclosure. Specifically, in step S105, dissolving two-component epoxy resin by using a solvent, and adding a polyether siloxane wetting agent, to obtain a two-component epoxy resin mixture; in step S106, adding carbon powder into the two-component epoxy resin mixture, mixing them for 20~40 minutes, and then ball-milling them for 1.5~2.5 hours to uniformly mix them, so as to obtain a wave-absorbing impregnation glue liquid; in step S107, dipping a honeycomb into the wave-absorbing impregnation glue liquid, taking out the dipped honeycomb and curing them to obtain a wave-absorbing honeycomb. For a specific operation process of the foregoing steps, refer to corresponding steps in FIG. 1 and FIG. 2.

According to the wave-absorbing honeycomb preparation method provided in the present disclosure, the wave-absorbing adhesive is prepared by using the two-component epoxy resin, the solvent, the wetting agent, and the carbon powder, and the wave-absorbing honeycomb is prepared by dipping the honeycomb into the wave-absorbing adhesive and curing them. The wave-absorbing adhesive prepared according to the above method can be evenly applied to the honeycomb surface. Therefore, the prepared wave-absorbing honeycomb does not block the hole, has no deformation, and has excellent wave-absorbing performance, and can be widely applied to fields such as the aerospace, aircraft, radome, and the like.

Embodiment 1

After dissolving 100 g two-component epoxy resin by using 400 g ethanol, adding 0.5 g polyether siloxane wetting agent A-008h, and then stirring them at a stirring rate of 1600 rpm for 10 minutes to uniformly mix them, so as to obtain a mixture. Adding 20 g carbon powder that is used as a wave-absorbing agent into the mixture, stirring them for 30 minutes to uniformly mix them, and then pouring them into a ball-milling tank to ball-mill them for 2 hours, so as to obtain a wave-absorbing adhesive. Wherein the two-component epoxy resin includes bisphenol A epoxy resin and a curing agent, the curing agent is diethylenetriamine, and a mass ratio of the epoxy resin to the curing agent in the two-component epoxy resin is 20:1.

Dipping aramid honeycomb into the wave-absorbing adhesive for 5 minutes, taking out the dipped aramid honeycomb, blowing off the wave-absorbing adhesive from holes of the dipped aramid honeycomb, and curing them in an oven at a temperature of 80° C. for 1 hour, so as to obtain the wave-absorbing honeycomb.

Embodiment 2

After dissolving 100 g two-component epoxy resin by using 400 g ethyl acetate, adding 1 g polyether siloxane wetting agent A-008h, and then stirring them at a stirring rate of 2000 rpm for 10 minutes to uniformly mix them, so as to obtain a mixture. Adding 20 g carbon powder that is used as a wave-absorbing agent into the mixture, stirring them for 30 minutes to uniformly mix them, and then pouring them into a ball-milling tank to ball-mill them for 2 hours, so as to obtain a wave-absorbing adhesive. Wherein the two-component epoxy resin includes bisphenol F epoxy resin and a curing agent, the curing agent is triethylenetetramine, and a mass ratio of the epoxy resin to the curing agent in the two-component epoxy resin is 5:1.

Dipping aramid honeycomb into the wave-absorbing adhesive for 5 minutes, taking out the dipped aramid honeycomb, blowing off the wave-absorbing adhesive from holes of the dipped aramid honeycomb, and then curing them in an oven at a temperature of 120° C. for 2 hours, so as to obtain the wave-absorbing honeycomb.

Embodiment 3

After dissolving 100 g two-component epoxy resin by using 400 g acetone, adding 0.5 g polyether siloxane wetting agent A-008h, and then stirring them at a stirring rate of 1800 rpm for 10 minutes to uniformly mix them, so as to obtain a mixture. Adding 20 g carbon powder that is used as a wave-absorbing agent into the mixture, stirring them for 30 minutes to uniformly mix them, and then pouring them into a ball-milling tank to ball-mill them for 2 hours, so as to obtain a wave-absorbing adhesive. Wherein the two-component epoxy resin includes bisphenol A epoxy resin and a curing agent, the curing agent is tetraethylenepentamine, and a mass ratio of the epoxy resin to the curing agent in the two-component epoxy resin is 10:1.

Dipping aramid honeycomb into the wave-absorbing adhesive for 5 minutes, taking out the dipped aramid honeycomb, blowing off the wave-absorbing adhesive from holes of the dipped aramid honeycomb, and then curing them in an oven at a temperature of 100° C. for 1.5 hours, so as to obtain the wave-absorbing honeycomb.

Embodiment 4

After dissolving 100 g two-component epoxy resin by using 400 g butanone, adding 0.5 g polyether siloxane wetting agent W-23h, and then stirring them at a stirring rate of 1700 rpm for 10 minutes to uniformly mix them, so as to obtain a mixture. Adding 20 g carbon powder that is used as a wave-absorbing agent into the mixture, stirring them for 30 minutes to uniformly mix them, and then pouring them into a ball-milling tank to ball-mill them for 2 hours, so as to obtain a wave-absorbing adhesive. Wherein the two-component epoxy resin includes bisphenol A epoxy resin and a curing agent, the curing agent is triethylenetetramine, and a mass ratio of the epoxy resin to the curing agent in the two-component epoxy resin is 15:1.

Dipping aramid honeycomb into the wave-absorbing adhesive for 5 minutes, taking out the dipped aramid honeycomb, blowing off the wave-absorbing adhesive from holes of the dipped aramid honeycomb, and then curing them in an oven at a temperature of 85° C. for 2 hours, so as to obtain the wave-absorbing honeycomb.

Embodiment 5

After dissolving 100 g two-component epoxy resin by using 300 g propanol methyl ether, adding 0.425 g polyether siloxane wetting agent A-004h, and then stirring them at a stirring rate of 1900 rpm for 8 minutes to uniformly mix them, so as to obtain a mixture. Adding 25 g carbon powder that is used as a wave-absorbing agent into the mixture, stirring them for 20 minutes to uniformly mix them, and then pouring them into a ball-milling tank to ball-mill them for 2.5 hours, so as to obtain a wave-absorbing adhesive. Wherein the two-component epoxy resin includes bisphenol F epoxy resin and a curing agent, the curing agent is tetraethylenepentamine, and a mass ratio of the epoxy resin to the curing agent in the two-component epoxy resin is 12:1.

Dipping aramid honeycomb into the wave-absorbing adhesive for 6 minutes, taking out the dipped aramid honeycomb, blowing off the wave-absorbing adhesive from holes of the dipped aramid honeycomb, and then curing them in an oven at a temperature of 110° C. for 1.5 hour, so as to obtain the wave-absorbing honeycomb.

Embodiment 6

After dissolving 100 g two-component epoxy resin by using 450 g propanol methyl ether, adding 0.8 g polyether siloxane wetting agent A-008h, and then stirring them at a stirring rate of 1700 rpm for 12 minutes to uniformly mix them, so as to obtain a mixture. Adding 18 g carbon powder that is used as a wave-absorbing agent into the mixture, stirring them for 25 minutes to uniformly mix them, and then pouring them into a ball-milling tank to ball-mill them for 2.5 hour, so as to obtain a wave-absorbing adhesive. Wherein the two-component epoxy resin includes bisphenol A epoxy resin and a curing agent, the curing agent is triethylenetetramine, and a mass ratio of the epoxy resin to the curing agent in the two-component epoxy resin is 8:1.

Dipping aramid honeycomb into the wave-absorbing adhesive for 4 minutes, taking out the dipped aramid honeycomb, blowing off the wave-absorbing adhesive from holes of the dipped aramid honeycomb, and then curing them in an oven at a temperature of 100° C. for 1 hour, so as to obtain the wave-absorbing honeycomb.

Embodiment 7

After dissolving 100 g two-component epoxy resin by using 500 g butanone, adding 0.8 g polyether siloxane wetting agent, and then stirring them at a stirring rate of 1700 rpm for 12 minutes to uniformly mix them, so as to obtain a mixture. Adding 30 g carbon powder that is used as a wave-absorbing agent into the mixture, stirring them for 40 minutes to uniformly mix them, and then pouring them into a ball-milling tank to ball-mill them for 1.5 hours, so as to obtain a wave-absorbing adhesive. Wherein the two-component epoxy resin includes bisphenol A epoxy resin and a curing agent, the curing agent is triethylenetetramine, and a mass ratio of the epoxy resin to the curing agent in the two-component epoxy resin is 18:1.

Dipping aramid honeycomb into the wave-absorbing adhesive for 5 minutes, taking out the dipped aramid honeycomb, blowing off the wave-absorbing adhesive from holes of the dipped aramid honeycomb, and then curing them in an oven at a temperature of 85° C. for 2 hours, so as to obtain the wave-absorbing honeycomb.

The wave-absorbing adhesives prepared in Embodiment 1 to Embodiment 7 are subjected to a surface tension test by using a hanging sheet method, and the test results are as follows:

TABLE 1

| | Surface tension test results | | | | | | |
| --- | --- | --- | --- | --- | --- | --- | --- |
| | Embodiment 1 | Embodiment 2 | Embodiment 3 | Embodiment 4 | Embodiment 5 | Embodiment 6 | Embodiment 7 |
| Surface tension mN/m | 27.6 | 29.7 | 30.0 | 30.8 | 32.1 | 26.2 | 34.7 |

The results show that the technical solution of the above embodiment can realize the lower surface tension of the wave-absorbing adhesive, so that the wave-absorbing adhesive can be quickly spread and coated on the honeycomb surface, and the honeycomb is not easy to block the hole.

The wave-absorbing honeycombs prepared in Embodiment 1 to Embodiment 7 are subjected to microwave absorbing chamber method for microwave absorbing performance test. The test results are as follows:

TABLE 2

| | Wave-absorbing performance test results | | | | | | |
| --- | --- | --- | --- | --- | --- | --- | --- |
| | Embodiment 1 | Embodiment 2 | Embodiment 3 | Embodiment 4 | Embodiment 5 | Embodiment 6 | Embodiment 7 |
| Reflectivity (3~18 GHz)/ ~dB | 14.2 | 15.3 | 14.7 | 15.2 | 16.3 | 14.0 | 17.5 |

The results show that the wave-absorbing honeycomb provided by the technical solutions of the above embodiment has excellent wave-absorbing performance.

It can be seen that the present disclosure provides the wave-absorbing impregnation glue liquid, the wave-absorbing honeycomb, and the preparation methods thereof. The wave-absorbing adhesive is prepared by using the two-component epoxy resin, the solvent, the wetting agent, and the carbon powder. The wave-absorbing honeycomb is prepared by dipping the honeycomb into the wave-absorbing adhesive and curing them.

The present disclosure reduces the surface tension of the wave absorbing adhesive by adding a polyether silicone wetting agent having extremely low surface tension and having antifoaming property, so that the wave-absorbing adhesive is quickly and uniformly spread on the honeycomb surface, so as to the wave-absorbing honeycomb material that does not block the hole, has no deformation, and has excellent wave-absorbing performance, which can be widely used in aerospace, aircraft, radome and the like.

The above descriptions are merely preferred embodiments of the present disclosure, but are not intended to limit the present disclosure. Any modification, equivalent replacement, or improvement made within the spirit and principle of the present disclosure shall fall within the protection scope of the present disclosure.

What is claimed is:

1. A preparation method of a wave-absorbing honeycomb, wherein the preparation method comprises:
   dipping a honeycomb into a wave-absorbing impregnation glue liquid, taking out the dipped honeycomb, and then curing them, so as to obtain a wave-absorbing honeycomb; wherein the wave-absorbing impregnation glue liquid comprises:
   two-component epoxy resin;
   a solvent;
   a polyether siloxane; and
   a carbon powder;
   wherein a mass ratio of the two-component epoxy resin to the solvent is 1:3~1:5, a mass ratio of the two-component epoxy resin to the carbon powder is 3:1~6:1, and a mass fraction of the polyether siloxane in the wave-absorbing impregnation glue liquid is 0.05%~0.2%.

2. The preparation method according to claim 1, further comprising:
   dipping the honeycomb into the wave-absorbing impregnation glue liquid for 4~6 minutes, taking out the dipped honeycomb, blowing off the wave-absorbing impregnation glue liquid from holes of the dipped honeycomb, and then curing them at a temperature of 80° C.~120° C. for 1~2 hours, so as to obtain the wave-absorbing honeycomb.

3. The preparation method according to claim 1, wherein the honeycomb is an aramid honeycomb.

4. The preparation method of the wave-absorbing impregnation glue liquid according to claim 1, wherein the two-component epoxy resin comprises an epoxy resin and a curing agent; the epoxy resin comprises bisphenol A epoxy resin, bisphenol F epoxy resin, or a mixture of the bisphenol A epoxy resin and the bisphenol F epoxy resin; and the curing agent comprises one or more of diethylenetriamine, triethylenetetramine, and tetraethylenepentamine.

5. The preparation method of the wave-absorbing impregnation glue liquid according to claim 4, wherein a mass ratio of the epoxy resin to the curing agent in the two-component epoxy resin is 100:5~100:20.

6. The preparation method of the wave-absorbing impregnation glue liquid according to claim 1, wherein the polyether siloxane is one or more of a polyether siloxane wetting agent A-008h, a polyether siloxane wetting agent A-004h, and a polyether siloxane wetting agent W-23h.

7. The preparation method of the wave-absorbing honeycomb according to claim 1, wherein the mass ratio of the two-component epoxy resin to the solvent is 1:4, the mass ratio of the two-component epoxy resin to the carbon powder is 5:1, and the mass fraction of the polyether siloxane in the wave-absorbing impregnation glue liquid is 0.1%.

8. The preparation method of the wave-absorbing honeycomb according to claim 1, wherein the two-component epoxy resin comprises an epoxy resin and a curing agent; the epoxy resin comprises bisphenol A epoxy resin, bisphenol F epoxy resin, or a mixture of the bisphenol A epoxy resin and the bisphenol F epoxy resin; and the curing agent comprises one or more of diethylenetriamine, triethylenetetramine, and tetraethylenepentamine.

9. The preparation method of the wave-absorbing honeycomb according to claim 1, wherein the solvent is one or more of methanol, ethanol, ethyl acetate, acetone, butanone, and propanol methyl ether.

* * * * *